US012393124B2

(12) United States Patent
Huang et al.

(10) Patent No.: US 12,393,124 B2
(45) Date of Patent: *Aug. 19, 2025

(54) HIGH THROUGHPUT AND HIGH POSITION ACCURATE METHOD FOR PARTICLE INSPECTION OF MASK PODS

(71) Applicant: Taiwan Semiconductor Manufacturing Company, Ltd., Hsinchu (TW)

(72) Inventors: Shih-Jui Huang, Hsinchu (TW); ShinAn Ku, Hsinchu (TW); Ting-Hao Hsu, Hsinchu (TW); Hsin-Chang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/664,027

(22) Filed: May 14, 2024

(65) Prior Publication Data

US 2024/0295826 A1    Sep. 5, 2024

Related U.S. Application Data

(63) Continuation of application No. 18/126,880, filed on Mar. 27, 2023, now Pat. No. 12,013,646, which is a
(Continued)

(51) Int. Cl.
*G03F 7/00* (2006.01)
*G03F 1/66* (2012.01)
*G03F 1/82* (2012.01)

(52) U.S. Cl.
CPC ............ *G03F 7/70608* (2013.01); *G03F 1/66* (2013.01); *G03F 1/82* (2013.01); *G03F 7/70491* (2013.01);
(Continued)

(58) Field of Classification Search
CPC .......... G03F 7/70608; G03F 1/66; G03F 1/82; G03F 7/70491; G03F 7/7085;
(Continued)

(56) References Cited

U.S. PATENT DOCUMENTS 6,327,021 B1    12/2001  Higashiguchi
10,831,115 B1   11/2020  Moon et al.
(Continued)

OTHER PUBLICATIONS

Non-Final Office Action issued in U.S. Appl. No. 17/402,043, dated Jul. 15, 2022.
(Continued)

*Primary Examiner* — Christina A Riddle
(74) *Attorney, Agent, or Firm* — STUDEBAKER BRACKETT PLLC

(57) ABSTRACT

A method of inspecting an outer surface of a mask pod includes moving a stage holding a mask pod such that the stage stops at each location of a plurality of locations under an outer surface of the mask pod for a predefined amount of time. At each location of the plurality of locations, the method further includes directing a stream of air to the outer surface of the mask pod, capturing an image of scattered air from each location of the plurality of locations of the outer surface of the mask pod, and determining a number of particles in the scattered air as a sampled number of particles based on the captured image. The method also includes generating a map of particles on the outer surface of the mask pod based on the sampled number of particles at each of the plurality of locations.

20 Claims, 8 Drawing Sheets

Related U.S. Application Data continuation of application No. 17/402,043, filed on Aug. 13, 2021, now Pat. No. 11,614,691.

(52) U.S. Cl.
CPC ........ *G03F 7/70741* (2013.01); *G03F 7/7085* (2013.01); *G03F 7/70925* (2013.01)

(58) Field of Classification Search
CPC .... G03F 7/70925; G03F 7/70741; G03F 1/68; G03F 1/84; G03F 7/70; G03F 7/70691; G03F 7/70733; G03F 7/708; G03F 7/70808; G03F 7/70825; G03F 7/70841; G03F 7/70858; G03F 7/70866; G03F 7/70875; G03F 7/70908–70941; G03F 7/7095; G03F 7/70958; G03F 7/70975; G03F 7/70983; G03F 7/70991; G01N 1/24; G01N 15/10; H01L 21/67376; H01L 21/67386; H01L 21/67389; H01L 21/67393; H01L 21/67359
USPC ..... 356/237.1–237.6; 355/30, 52–55, 67–77; 73/23.2, 28.01; 430/5, 22, 30
See application file for complete search history.

(56) References Cited

U.S. PATENT DOCUMENTS

| | | | |
|---|---|---|---|
| 11,614,691 | B2 | 3/2023 | Huang et al. |
| 12,013,646 | B2 * | 6/2024 | Huang ..................... G03F 1/82 |
| 2012/0247504 | A1 | 10/2012 | Nasr et al. |
| 2020/0019075 | A1 | 1/2020 | Yen et al. |
| 2020/0105560 | A1 | 4/2020 | Chen et al. |

OTHER PUBLICATIONS

Notice of Allowance issued in U.S. Appl. No. 17/402,043, dated Nov. 23, 2022.
Non-Final Office Action issued in U.S. Appl. No. 18/126,880, dated Oct. 26, 2023.
Noitce of Allowance issued in U.S. Appl. No. 18/126,880, dated Feb. 14, 2024.

* cited by examiner

700

```
┌─────────────────────────────────────────────────────────────────────────────────┐
│ Direct a stream of air at a first location of a plurality of locations on an outer surface of a mask pod │─ S710
└─────────────────────────────────────────────────────────────────────────────────┘
                                         ▼
┌─────────────────────────────────────────────────────────────────────────────────┐
│ Remove one or more particles by the directed stream of air from the first location on the outer │─ S720
│                              surface of the mask pod                            │
└─────────────────────────────────────────────────────────────────────────────────┘
                                         ▼
┌─────────────────────────────────────────────────────────────────────────────────┐
│        Extract scattered air from the first location of the outer surface of the mask pod        │─ S730
└─────────────────────────────────────────────────────────────────────────────────┘
                                         ▼
┌─────────────────────────────────────────────────────────────────────────────────┐
│ Determine a number of particles in the extracted scattered air from the first location as a sampled │─ S740
│                         number of particles at the first location                │
└─────────────────────────────────────────────────────────────────────────────────┘
                                         ▼
┌─────────────────────────────────────────────────────────────────────────────────┐
│ Move the mask pod and direct the stream of air at other locations of the plurality of locations on the │─ S750
│ outer surface of the mask pod to determine the sampled number of particles at the other locations │
└─────────────────────────────────────────────────────────────────────────────────┘
                                         ▼
┌─────────────────────────────────────────────────────────────────────────────────┐
│ Generate a map of the particles on the outer surface of the mask pod based on the sampled number │─ S760
│                         of particles at the plurality of locations               │
└─────────────────────────────────────────────────────────────────────────────────┘
```

Fig. 7

HIGH THROUGHPUT AND HIGH POSITION ACCURATE METHOD FOR PARTICLE INSPECTION OF MASK PODS

CROSS-REFERENCE TO RELATED APPLICATIONS

This application is a continuation application of U.S. patent application Ser. No. 18/126,880 filed on Mar. 27, 2023, now U.S. Pat. No. 12,013,646, which is a continuation application of U.S. non-provisional patent application Ser. No. 17/402,043, now U.S. Pat. No. 11,614,691, filed on Aug. 13, 2021, the entire content of each application is incorporated herein by reference.

BACKGROUND

During an integrated circuit (IC) design, a number of patterns of the IC, for different steps of IC processing, are generated on a substrate, e.g., a wafer. The patterns may be produced by projecting, e.g., imaging, layout patterns of a photo mask on a photo resist layer of the substrate. A lithographic process transfers the layout patterns of the photo masks to the photo resist layer of the substrate such that etching, implantation, or other steps are applied only to predefined regions of the substrate. In general, the reticles, e.g., the extreme ultraviolet (EUV) photo mask, are transferred inside a mask pod between different EUV lithographic systems. Each mask pod has an outer pod and an inner pod inside the outer pod. The outer pod is opened outside the EUV lithographic system and the inner pod is retrieved from the outer pod. The inner pod is transferred to the EUV lithographic system. The inner pod is opened inside the EUV lithographic system and the EUV photo mask is retrieved from the inner pod to be used for EUV lithography. The particles attached on an outer surface of the inner pod may be transferred into the EUV lithographic system and may be deposited on the EUV photo mask or on the optics used for EUV lithography and, thus, may cause non-uniformity in the critical dimension (CD) of the resist patterns generated on the substrate. Therefore, it is desirable to carry the EUV photo mask inside a clean inner pod when transferring the EUV photo mask into the lithographic system for performing the lithographic process.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 7 shows a flow diagram of an exemplary process for inspecting the particles on a mask pod in accordance with some embodiments of the present disclosure.

DETAILED DESCRIPTION

Figure 1:
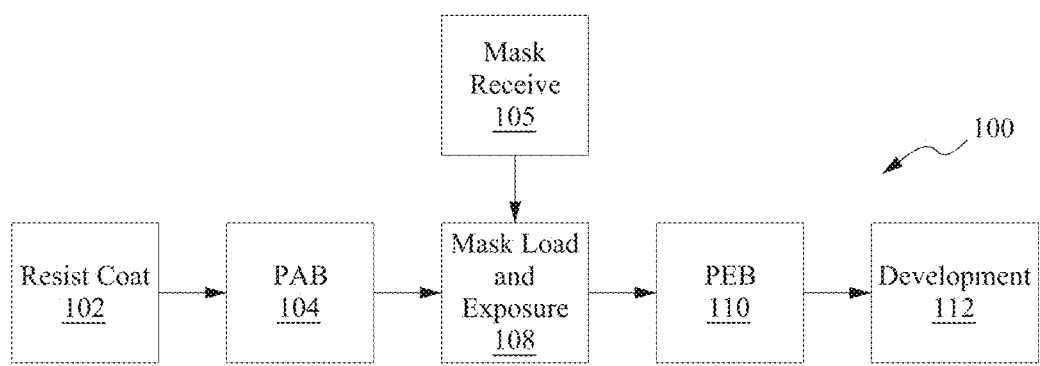
FIG. 1 shows a process flow for generating a photo resist pattern on a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the reticles are stored and transferred, inside mask pods, between IC processing stations, e.g., between the EUV lithographic systems of the IC processing stations. In some embodiments, dual mask pods with an inner pod enclosed inside an outer pod are used for transferring the reticles. The reticle is inside the inner pod. When a reticle is used in a EUV lithographic system, the outer pod of the dual mask pod is opened and the inner pod, including the reticle inside the inner pod, is transferred inside the EUV lithographic system. Therefore, the inner pod, including the outer surface of the inner pod should be cleaned before transferring the inner pod and the reticle to the EUV lithographic systems. Thus, the inner pod of a dual pod needs inspection before being transferred inside the EUV lithographic system and if the inner pod is not clean and has particles on the outer surface of the inner pod, the inner pod may be cleaned. In some embodiments, the inner pod of a dual pod is inspected and cleaned offline before being transferred into the EUV lithographic system and in a stand-alone tool.

One way of inspecting the inner pod of a reticle is capturing images of the outer surface of the inner pod from different locations of the outer surface of the inner pod, inspecting the captured images, e.g., enlarged captured images, and finding and counting the particles in the captured images. Capturing and processing images may take a long time and may need to rotate the inner pod such that the images are captured from a single viewing angle of the inner pod.

In some embodiments, a stream of gas, e.g., a stream of air, is directed to the outer surface of the inner pod. The stream of gas may be directed through a nozzle to exert pressure on the particles attached to the outer surface of the inner pod to eject one or more particles from the outer surface of the inner pod. The ejected particles are carried with the scattered air that is returned from the outer surface of the inner pod. In some embodiment, the scattered air from the outer surface of the inner pod, including the one or more ejected particles is collected by, e.g., sucked into, a particle counter, where the particle counter determines the number of the ejected particles. In some embodiments, based on the speed of the stream of gas that is directed at the outer surface of the inner pod, and the amount of time the stream of gas is directed at each predefined location on the outer surface of the inner pod, a known percentage of the particles at the predefined locations are ejected from the outer surface of the inner pod. Thus, the number of particles counted by the particle counter at each predefined location has a proportionality ratio with the number of particles attached to the outer surface of the inner pod. Therefore, the number of particles attached to the outer surface of the inner pod may be determined from the number of the ejected particles that are counted by the particle counter and using the proportionality ratio. In some embodiments, the stream of gas ejects the particles in an area covered by the extent of the stream of gas and, therefore, the number of the ejected particles that are counted by the particle counter corresponds to an area covered by the stream of gas. Thus, in some embodiments, the number of the ejected particles that are counted by the particle counter is a density of the particles (e.g., number of particles per unit area) at the surface area of the inner pod.

In some embodiments, the number of particles or the density of particles attached to the outer surface of the inner pod may be compared with a threshold number of particles or a threshold density of particles and if the number of particles or the density of particles attached to the outer surface of the inner pod exceeds the threshold number of particles or the threshold density of particles, at one or more points, the inner pod may be designated for cleaning.

In some embodiments, the reticle is mounted above the nozzle on a horizontal stage that moves the reticle laterally in X-direction and Y-direction. The nozzle that is used for directing the gas stream is mounted on a vertical stage. The vertical stage moves the nozzle up and down in Z-direction. The distance between the nozzle and the outer surface of the inner pod is adjusted by moving the vertical stage. In some embodiments, the nozzle on the top surface of the vertical stage is mounted such that the steam of gas is directed at a specific angle with respect to a perpendicular plane to the outer surface of the inner pod. Thus, the scattered gas from the outer surface of the inner pod is collected by the particle counter around an opposite angle with respect to the perpendicular plane. In some embodiments, the specific angle is adjusted to increase the efficiency of the particle counter for collecting the scattered gas and the particles carried with the scattered gas from the outer surface of the inner pod.

The horizontal stage is moved in the XY-plane and the stream of air is directed at a plurality of locations on the outer surface of the inner pod. The horizontal stage stops at each one of the plurality of locations for a specific amount of time. As noted above, during the specific amount of time that the horizontal stage stops at each location, the scattered gas from the outer surface of the inner pod is collected by a particle counter. The particle counter determines the number of the particles ejected from the outer surface of the inner pod that are carried with the scattered gas. As described, the determined number of particles at each location is proportional to the number of particles on the outer surface of the inner pod. Thus, based on the readings of the particle counter at the plurality of the locations, the density of particles is sampled at the plurality of locations on the outer surface of the inner pod and a mapping of the density of particles on the outer surface of the inner pod may be generated. In some embodiments, the inner pod is flipped over and installed on the horizontal stage such that the number of particles, e.g., the density of particles, on another side of the outer surface of the inner pod is determined, e.g., measured.

Figure 4:
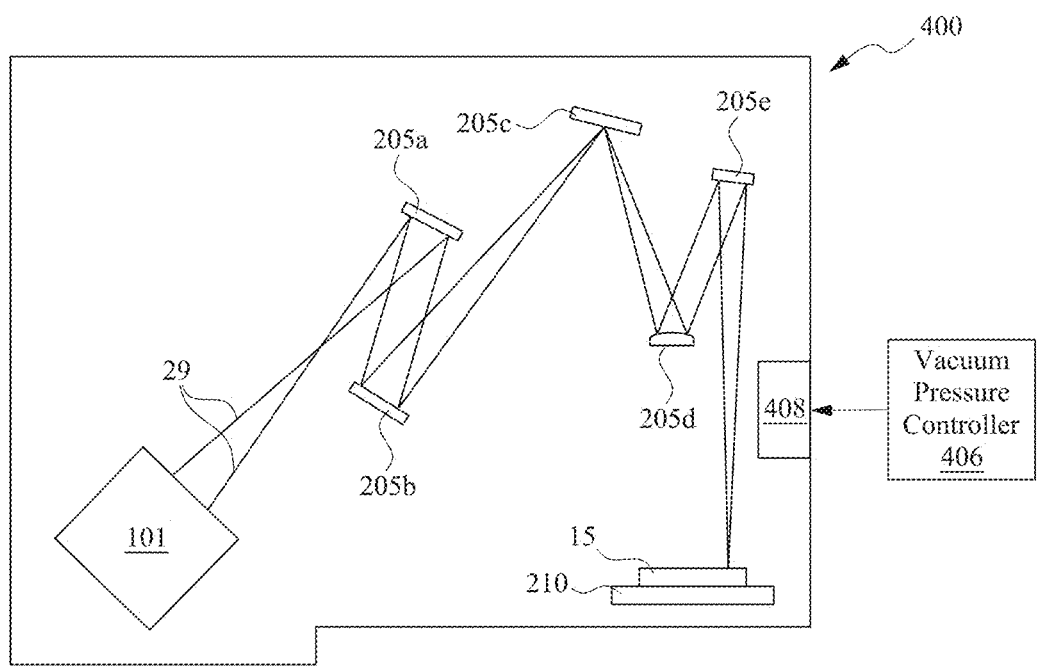
FIG. 4 shows a schematic view of an EUV lithography (EUVL) exposure device for generating a photo resist pattern on a wafer.

FIG. 1 shows a process flow 100 for generating a photo resist pattern on a semiconductor substrate by a lithographic system. In some embodiments, the process flow 100 is performed by the control system 600 of FIG. 6 or the computer system 800 of FIGS. 8A and 8B. In a resist coat operation 102, a resist layer of a resist material is disposed, e.g., coated, on a top surface of a substrate, e.g., a wafer or a work piece. As shown in FIG. 4, a photo resist layer 15 is disposed over a semiconductor substrate 210. The post application bake (PAB) is performed at a PAB operation 104 and the semiconductor substrate 210 including the photo resist layer 15 is baked to drive out solvent in the resist material and solidify the photo resist layer on top of the semiconductor substrate 210.

In the present disclosure, the terms mask, photomask, and reticle are used interchangeably. In addition, the terms resist and photo resist are used interchangeably. At a mask receive operation 105, a reticle is received from another lithographic system. The mask receive operation 105 is described in more detail with respect to FIGS. 2 and 3. The received reticle is loaded by a mask load and exposure operation 108 to an exposure device, which is described with respect to FIG. 4. The mask load and exposure operation 108 also projects the mask, using actinic radiation of a radiation source onto the photo resist layer 15 of the semiconductor substrate 210. In some embodiments, a layout pattern on the mask is projected by an extreme ultraviolet (EUV) radiation from an EUV light source onto the photo resist layer 15 to generate a resist pattern in the photo resist layer 15 on the semiconductor substrate 210. A post exposure bake (PEB) is performed at a PEB operation 110 on the wafer where the resist layer 15 is further baked after being exposed to the actinic radiation and before being developed in a development operation 112. By applying a developer solution to the photo resist layer 15, the resist material of the resist layer is developed. For a positive tone resist material, in the development operation 112, the exposed regions are developed by applying a developer solution and then the developed regions are removed and the remaining regions generate the resist pattern of the photo resist layer 15. For a negative tone resist material, in the development operation 112, the non-exposed regions are developed by applying the developer solution and the developed regions are subsequently removed and the remaining regions generate the resist pattern of the photo resist layer 15. In some embodiments, the mask receive operation 105 is performed offline and outside the EUV lithographic system. The received reticle may be stored in a reticle library (not shown) under a vacuum environment.

Figure 2:
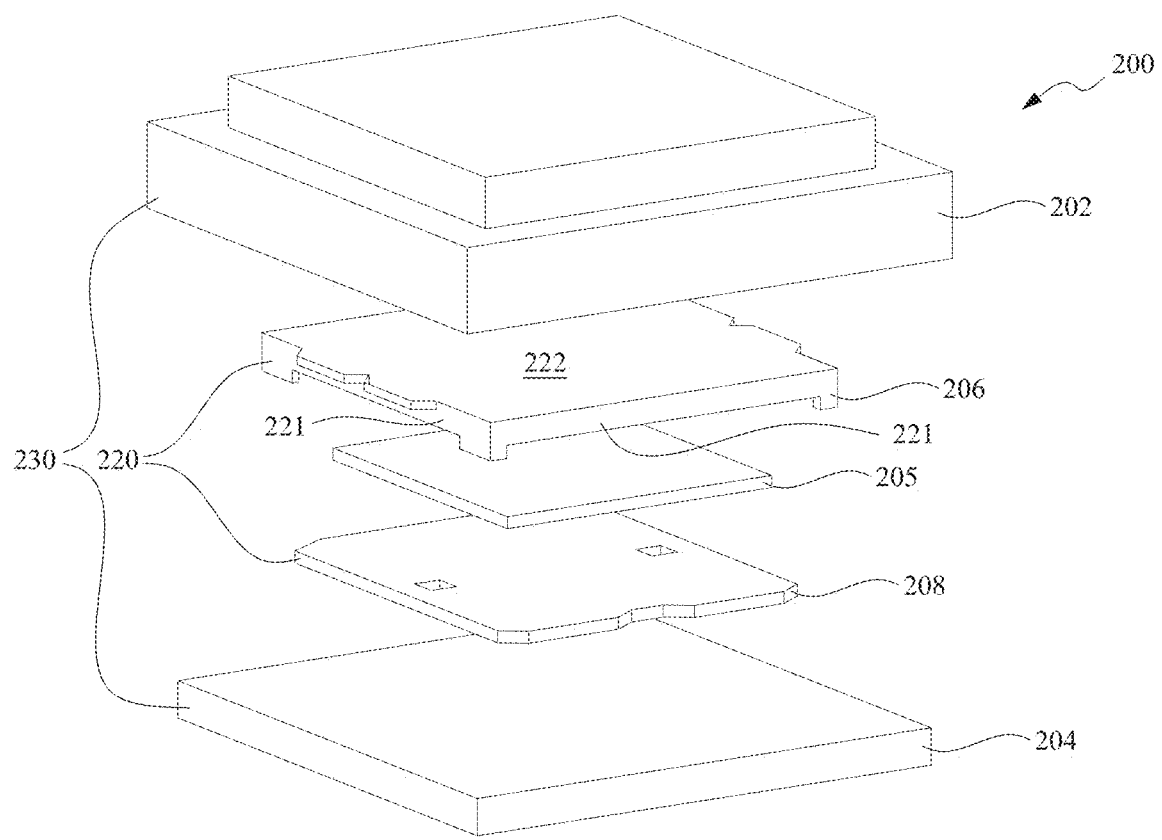
FIG. 2 shows a schematic diagram of dual mask pod for storing and transferring an EUV photo mask.

FIG. 2 shows a schematic diagram of dual mask pod 200 for storing and transferring an EUV photo mask. The dual mask pod 200 includes an inner pod 220, which is enclosed inside an outer pod 230. The inner pod 220 is enclosed between the outer pod door 204 and the outer pod shell 202. The inner pod 220 includes an inner pod base plate 208 and an inner pod cover 206. A reticle 205 is enclosed between the inner pod base plate 208 and the inner pod cover 206. In some embodiments, the outer pod 230 is opened, e.g., the outer pod door 204 is removed, and the inner pod 220 is retrieved from the outer pod 230. In some embodiments, the inner pod 220 is opened, e.g., the inner pod cover 206 is removed, and the reticle 205 is retrieved from the inner pod 220. The inner pod cover 206 has a top outer surface 222 and side outer surfaces 221. The inner pod base plate 208 also has a bottom outer surface (not shown) and side outer surfaces (not shown). In some embodiments, the reticle 205 is stored inside the dual mask pod 200. The reticle 205 is inside an inner pod 220, which is inside an outer pod 230 to keep the reticle 205 away from particles. In some embodiments, the reticle 205 is transferred between different lithographic systems inside the dual mask pod 200 to keep the reticle 205 away from the particles during transferring.

Figure 3:
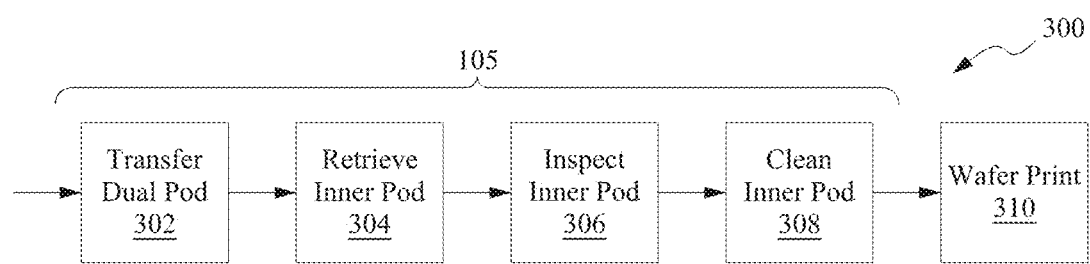
FIG. 3 shows a process flow for generating a photo resist pattern on a semiconductor substrate in accordance with some embodiments of the present disclosure.

FIG. 3 shows a process flow 300 for generating a photo resist pattern on a semiconductor substrate in accordance with some embodiments of the present disclosure. In a transfer dual pod operation 302, a dual pod, e.g., the dual mask pod 200 of FIG. 2, is transferred by a mask transfer system (not shown) to be used in an exposure device, e.g., an exposure device 400 of FIG. 4, of an EUV lithographic system. In a retrieve inner pod operation 304, the inner pod 220 is retrieved from the dual mask pod 200. The retrieval operation is performed outside the exposure device 400. The inner pod 220 that contains a reticle 205 is retrieved from the outer pod 230 of the dual mask pod 200. In an inspect inner pod operation 306, the inner pod 220 is inspected for particles that are deposited on the outer surface of the inner pod 220, e.g., the top outer surface 222 of the inner pod cover 206. In some embodiments, the inner pod 220 is inspected by the inspection system 500 for inspecting the particles on the mask pod of FIG. 5B. If the inspection system 500 determines that the particles on the outer surface of the inner pod are above a threshold number of particles or the threshold density of particles, at one or more points, a clean inner pod operation 308 is performed on the outer surface of the inner pod 220. In a wafer print operation 310, the inner pod 220 is transferred to the exposure device 400 and the reticle 205 is retrieved from the inner pod and is used in the exposure device 400 for projecting the layout patterns of the reticle 205 on a resist layer of a wafer and developing a resist pattern on the wafer as described with respect to FIG. 1. In some embodiments, the wafer print operation 310 is consistent with the operations of the process flow 100. The mask receive operation 105 of FIG. 1 includes the transfer dual pod operation 302, the retrieve inner pod operation 304, the inspect inner pod operation 306, and the clean inner pod operation 308. In some embodiments, the transfer dual pod operation 302, the retrieve inner pod operation 304, the inspect inner pod operation 306, and the clean inner pod operation 308 are performed offline and before the reticle is transferred inside the exposure device 400. In some embodiments, after inspecting and cleaning the inner pod 220, the inner pod 220 is transferred into a reticle library (not shown) that is under vacuum environment and the photo mask is stored in the reticle library. In some embodiments, in the mask load and exposure operation 108, the photo mask is retrieved from the reticle library. In some embodiments, one or more of the transfer dual pod operation 302, the retrieve inner pod operation 304, the inspect inner pod operation 306, and the clean inner pod operation 308 are performed inside a load lock chamber of the EUV lithographic system and before the inner pod 220 is loaded into the exposure device 400 of the EUV lithographic system. In some embodiments, after the clean inner pod operation 308, the inner pod 220 is stored before the inner pod 220 is loaded into the exposure device 400 of the EUV lithographic system.

FIG. 4 shows a schematic view of an EUV lithography (EUVL) exposure device 400 for generating a photo resist pattern on a wafer. The EUVL exposure device 400 shows the exposure of photoresist coated substrate, a target semiconductor substrate 210, with a patterned beam of EUV light. The exposure device 400 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle, e.g., a reflective mask 205c consistent with reticle 205 of FIG. 2, with a beam of EUV radiation 29, to produce a patterned beam, and one or more reduction projection optics 205d, 205e, of the optical system for projecting the patterned beam onto the target semiconductor substrate 210. A mechanical assembly (not shown) may be provided for generating a controlled relative movement between the target semiconductor substrate 210 and patterning optic, e.g., a reflective mask 205c. By the controlled relative movement, different dice of the substrate are patterned. As further shown, the EUVL exposure device 400 of FIG. 4 further includes the EUV radiation source 101 to irradiate the target resist layer 15 on top of the semiconductor substrate 210. In some embodiments, because gas molecules absorb EUV light, the lithography system for the EUV lithography patterning, e.g., the exposure device 400 is under a vacuum environment to avoid EUV intensity loss. In some embodiments, a pressure inside the exposure device 400 is sensed by a pressure sensor 408 inside the exposure device 400 and is controlled by a vacuum pressure controller 406 that is coupled to the exposure device 400.

Figure 5A:
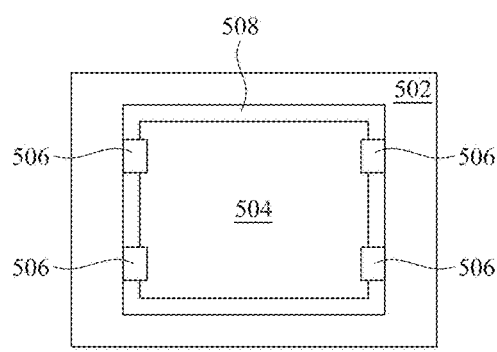
FIGS. 5A and 5B show a mask pod loaded on a stage and an inspection system for inspecting the particles on a mask pod in accordance with some embodiments of the present disclosure.
Figure 5B:
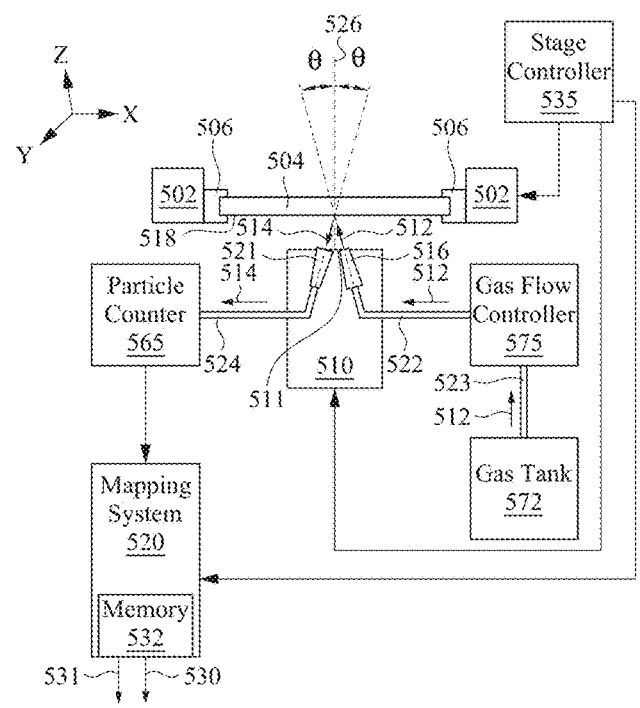

FIGS. 5A and 5B show a mask pod loaded on a stage and an inspection system 500 for inspecting the particles on a mask pod in accordance with some embodiments of the present disclosure. FIG. 5A shows a mask pod holder for carrying an inner pod 504 consistent with the inner pod 220 of FIG. 2, which is mounted on a horizontal stage 502. The inner pod 504 is mounted by clamps 506 and a distance 508 that is placed between the inner pod 504 and the horizontal stage 502 and provides tolerance for loading, in some embodiments.

FIG. 5B shows an inspection system 500 that includes the inner pod 504 mounted by clamps 506 on the horizontal stage 502. The horizontal stage is coupled to a stage controller 535 and the stage controller 535 moves the inner pod 504 in X-direction and Y-direction. The inspection system 500 also includes a vertical stage 510, a gas tank 572, a first pipe 522, a second pipe 523, and a gas flow controller 575. The vertical stage is also coupled to a stage controller 535 and the stage controller 535 moves the vertical stage up or down in Z-direction. The gas flow controller 575 is coupled, from one end and via the second pipe 523, to the gas tank 572. In some embodiments, instead of the gas tank 572, the second pipe 523 is connected to a gas source of an EUV lithographic system. The gas flow controller 575 is coupled from another end to a first end of the first pipe 522. The second end of the first pipe is connected to a nozzle 516 and the nozzle 516 is mounted on a top surface 511 of the vertical stage 510. In some embodiments, the nozzle 516 is a tapered nozzle that produces a narrow beam of air capable of removing the particles. In some embodiments, the nozzle 516 is a slit nozzle that produces a narrow sheet of air. The gas flow controller 575 draws a stream of gas 512 or air, e.g., clean dry air (CDA), or nitrogen gas, from the gas tank 572 and sends the stream of gas 512 to nozzle 516. The stream of gas 512 is directed at an incident angle θ with respect to a plane 526 vertical to an outer surface 518 of the inner pod 504. In some embodiments, the stage controller 535 adjusts a distance between the nozzle 516 and the outer surface 518 and the gas flow controller 575 adjusts the incident angle θ. In some embodiments, the horizontal stage 502 moves in the X-direction and the nozzle 516 moves in the Y-direction to scan the outer surface 518 of the inner pod 504 the horizontal stage 502 moves stays in each position in the X-direction while the nozzle 516 moves in the Y-direction.

In some embodiments, instead of the particle counter 565, an imaging device (not shown) is mounted on the top surface 511 of the vertical stage 510. The imaging device captures images of the scattered gas while the horizontal stage 502 moves, analyzes the captured images, and determines the number of particles in the scattered gas.

The inspection system 500 also includes a particle counter 565 that is coupled to a first end of a third pipe 524 and a second end of the third pipe is mounted on the top surface 511 of the vertical stage 510 via a nozzle 521. The particle counter 565 draws in, through the nozzle 521, the scattered gas that is reflected from the stream of gas 512 and the particles that are ejected by the stream of gas 512, from the outer surface 518, and are carried by the scattered gas. The scattered gas and the particles carried by the scattered gas are drawn from the second end of the third pipe and generate a stream of gas 514. The stream of gas 514 has an angle θ symmetrical with the incident angle θ with respect to the plane 526. In some embodiments, the particle counter 565 determines, e.g., counts, the number of particles that are ejected from the outer surface 518 and are carried by the scattered gas 514.

In some embodiments, the stage controller 535 moves the horizontal stage 502 such that the stream of gas 512 is directed to a plurality of locations at the outer surface 518 of the inner pod 504. In some embodiments, the horizontal stage 502 stops at each one of the plurality of locations for a predefined amount of time and the stream of gas 514 is drawn to, e.g., collected by, the particle counter 565 for the same predefined amount of time. Therefore, the particle counter 565 samples the number of particles ejected from the outer surface 518 of the inner pod 504 at the plurality of locations. In some embodiments, the predefined amount of time that the stage stops at the plurality of locations determines a proportionality factor between the number of ejected particles and the number of deposited particles at the plurality of locations. In some embodiments, the stream of gas 512 covers an area of the outer surface 518 of the inner pod 504 at each one of the plurality of locations. Thus, the number of particles counted by particle counter 565 when divided by the area covered by the stream of gas 512 generates the samples of the density of the ejected particles and if multiplied by the proportionality factor generates the samples of the density of the deposited particles on the outer surface 518 of the inner pod 504. In some embodiments, a specific portion of the scattered gas, e.g., a collection factor of the scattered gas, and the particles carried by the scattered gas, is collected by the particle counter 565 and the proportionality factor includes the collection factor.

The inspection system 500 also includes a mapping system 520 that is coupled to stage controller 535 and the particle counter 565. The mapping system 520 receives the plurality of the locations from the stage controller 535 and also receives the number or the density of the particles deposited on the outer surface 518 of the inner pod 504 and generates a map of the number of particles or a map of the density of the particles on the outer surface 518 of the inner pod 504. In some embodiments, the mapping system 520 or a main controller (not shown) coupled to the mapping system monitors the map of the number of particles or the map of the density of the particles on the outer surface 518 of the inner pod 504 and if the map exceeds a threshold of the number of particles or a threshold of the density of the particles, a signal 530 for cleaning the inner pod 504 is generated and is sent to the main controller. In some embodiments, the amount of time the horizontal stage 502 stops at each one of the plurality of locations is from about 1 second to about 10 seconds. In some embodiments, the area covered by the stream of gas 512 is between 50 mm$^2$ and 100 mm$^2$, e.g., a radius of between 7 mm and 10 mm. In some embodiments, the mapping system 520 includes a memory 532 and the maps of the number of particles or the maps of the density of the particles on the outer surface 518 of the inner pod 504 are stored in the memory 532 based on a specific ID for each inner pod 220. When an inner pod 504 is inspected and the maps of the number of particles or the maps of the density of the particle are calculated, the produced map is compared, based on the ID of inner pod, with the previously generated maps. When an anomaly is determined between the recently generated map and the maps stored in the memory 532 a signal 531 is generated by the mapping system 520 to indicate that other EUV lithographic systems or the mask transfer system are faulty.

Figure 6:
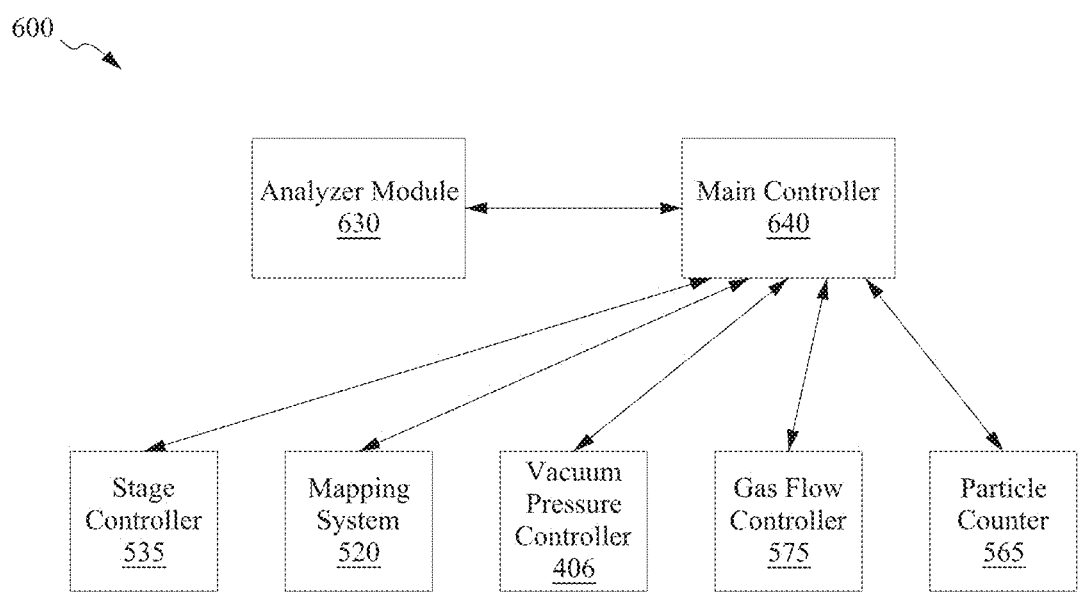
FIG. 6 shows a control system for inspecting the particles on a mask pod in accordance with some embodiments of the present disclosure.

FIG. 6 shows a control system 600 for inspecting the particles on a mask pod in accordance with some embodiments of the present disclosure. The control system 600 includes an analyzer module 630 and a main controller 640 coupled to each other. In some embodiments, the control system 600 includes the stage controller 535 of FIG. 5B, the mapping system 520 of FIG. 5B, the gas flow controller 575 of FIG. 5B, the particle counter 565 of FIG. 5B, and the vacuum pressure controller 406 of FIG. 4. In some embodiments, the main controller 640 is coupled to and controls the stage controller 535 of FIG. 5B, the mapping system 520 of FIG. 5B, the gas flow controller 575 of FIG. 5B, the particle counter 565 of FIG. 5B, and the vacuum pressure controller 406 of FIG. 4. In some embodiments, the main controller 640 is directly coupled to the mapping system 520 or is coupled to the mapping system 520 via the analyzer module 630. In some embodiments, a circuitry performs the operations of the analyzer module 630 and the main controller 640.

In some embodiments and referring to FIG. 5B, the main controller 640 commands the gas flow controller 575, to direct the stream of gas 512, via the second pipe 523, from the gas tank 572 to gas flow controller 575, and also direct the stream of gas 512, via the first pipe 522 and the nozzle 516 to the outer surface 518 of the mask pod 504. In some embodiments, the main controller 640 commands the stage controller 535 to move the horizontal stage 502 the X-direction and the Y-direction to direct the stream of gas 512 at different locations of the outer surface 518. In some embodiments, the main controller 640 commands the particle counter 565 to draw the stream of gas 514, which is the scattered gas from the outer surface 518 of the plurality of locations via the third pipe 524 to the particle counter 565. The main controller 640 commands the particle counter 565 to count the number of particles in the stream of gas 514 and send the counted number of particles to the mapping system 520.

In some embodiments, the main controller 640 commands the stage controller 535 to move the horizontal stage 502 and to direct the stream of gas 512 at different locations of the outer surface 518 for a predefined amount of time, e.g., from about 1 second to about 10 seconds. In addition, the main controller 640 commands the particle counter 565 to count the number of particles in the stream of gas 514 for the predefined amount of time and send the counted number of particles to the mapping system 520. In some embodiments, the counted number of particles in the scattered gas from the outer surface 518 at each location is proportional to the number of particles on the outer surface 518 of the mask pod 504. In some embodiments, the analyzer module 630 receives the counted number of particles and compares the counted number of particles with a threshold. If the counted number of particles, at one or more locations, is above the threshold, the analyzer module 630 sends a signal to the main controller 640 that the mask pod requires cleaning.

FIG. 7 illustrates a flow diagram of an exemplary process 700 for inspecting the particles on a mask pod in accordance with some embodiments of the present disclosure. The process 700 or a portion of the process 700 may be performed by the system of FIG. 5B. In some embodiments, the process 700 or a portion of the process 700 is performed and/or is controlled by the computer system 800 described below with respect to FIGS. 8A and 8B. In some embodiments, the process 700 or a portion of the process 700 is performed by the control system 600 of FIG. 6 described above. The method includes an operation S710, where a stream of air is directed at a first location of a plurality of locations on an outer surface of the mask pod. As shown in FIG. 5B, the stream of gas 512, e.g., air, is directed at a first location of a plurality of locations on the outer surface 518 of the mask pod 504. In operation S720, one or more particles are removed by the directed stream of air from the first location on the outer surface of the mask pod. In some embodiments, particles are attached to the outer surface 518 of the mask pod 504. The stream of gas 512 ejects, e.g., removes, some of the particles from the outer surface 518 and scatters back from the outer surface 518 and carries the ejected particles. In operation S730, the scattered air from the first location of the outer surface of the mask pod is extracted, e.g., is collected. As shown in FIG. 5B, the particle counter 565 draws the scattered gas from the outer surface 518 in the stream of gas 514. The stream of gas 514 also draws the ejected particles to the particle counter. In operation S740, a number of particles in the extracted scattered air from the first location is determined as a sampled number of particles at the first location. In operation S750, the mask pod is moved and the stream of air is directed at other locations of the plurality of locations on the outer surface of the mask pod to determine the sampled number of particles at the other locations. As shown in FIG. 5B, the stage controller 535 moves the horizontal stage 502 and the inner pod 504 mounted on the horizontal stage 502 in the X-direction and the Y-direction and the stream of gas 514 hits other locations on the outer surface 518 of the mask pod 504 and determines the sampled number of particles at the other locations. In operation S760, a map of the particles on the outer surface of the mask pod is generated based on the sampled number of particles at the plurality of locations. In some embodiments, the map includes one or more 3-dimensional graphs where each 3-dimensional graph shows the number of particles on each sampled point of each side of the inner pod 220.

Figure 8A:
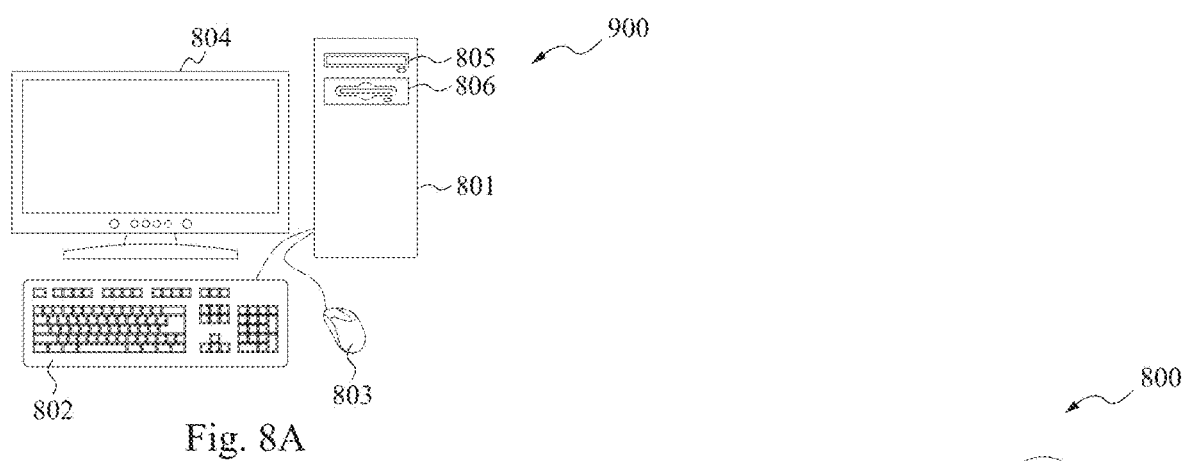
FIGS. 8A and 8B illustrate an apparatus for inspecting the particles on a mask pod in accordance with some embodiments of the present disclosure.
Figure 8B:
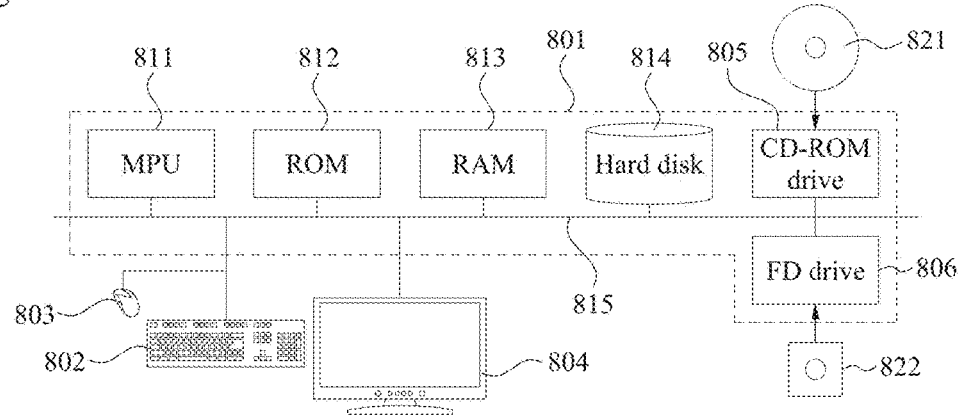

FIGS. 8A and 8B illustrate an apparatus for inspecting the particles on a mask pod in accordance with some embodiments of the present disclosure. In some embodiments, the computer system 800 is used for performing the functions of the modules of FIG. 6 that include the main controller 640, the analyzer module 630, the stage controller 535, the mapping system 520, the vacuum pressure controller 406, the gas flow controller 575, and the particle counter 565. In some embodiments, the computer system 800 is used to execute the process 700 of FIG. 7.

FIG. 8A is a schematic view of a computer system that performs the functions of an apparatus for inspecting the particles on a mask pod. All of or a part of the processes, method and/or operations of the foregoing embodiments can be realized using computer hardware and computer programs executed thereon. In FIG. 8A, a computer system 800 is provided with a computer 801 including an optical disk read only memory (e.g., CD-ROM or DVD-ROM) drive 805 and a magnetic disk drive 806, a keyboard 802, a mouse 803, and a monitor 804.

FIG. 8B is a diagram showing an internal configuration of the computer system 800. In FIG. 8B, the computer 801 is provided with, in addition to the optical disk drive 805 and the magnetic disk drive 806, one or more processors, such as a micro processing unit (MPU) 811, a ROM 812 in which a program such as a boot up program is stored, a random access memory (RAM) 813 that is connected to the MPU 811 and in which a command of an application program is temporarily stored and a temporary storage area is provided, a hard disk 814 in which an application program, a system program, and data are stored, and a bus 815 that connects the MPU 811, the ROM 812, and the like. Note that the computer 801 may include a network card (not shown) for providing a connection to a LAN.

The program for causing the computer system 800 to execute the functions for inspecting the particles on a mask pod in the foregoing embodiments may be stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer 801 and stored in the hard disk 814. At the time of execution, the program is loaded into the RAM 813. The program may be loaded from the optical disk 821 or the magnetic disk 822, or directly from a network. The program does not necessarily have to include, for example, an operating system (OS) or a third party program to cause the computer 801 to execute the functions of the control system for inspecting the particles on a mask pod in the foregoing embodiments. The program may only include a command portion to call an appropriate function (module) in a controlled mode and obtain desired results.

According to some embodiments of the present disclosure, a method of inspecting an outer surface of a mask pod includes directing a stream of air at a first location of a plurality of locations on an outer surface of a mask pod and removing one or more particles by the directed stream of air from the first location on the outer surface of the mask pod. The method also includes extracting scattered air from the first location of the outer surface of the mask pod and determining a number of particles in the extracted scattered air from the first location as a sampled number of particles at the first location. The method further includes moving the mask pod and directing the stream of air at other locations of the plurality of locations on the outer surface of the mask pod to determine the sampled number of particles in extracted scattered air at the other locations. The method also includes generating a map of the particles on the outer surface of the mask pod based on the determined sampled number of particles at the plurality of locations such that for each location of the plurality of locations, the sampled number of particles in the extracted scattered air is proportional to a number of particles on the outer surface of the mask pod at the location. In an embodiment, the mask pod is moved in an X-direction and a Y-direction and the plurality of locations are distributed in the X-direction and the Y-direction on the outer surface of the mask pod. In an embodiment, the method further includes delivering the stream of air by a tube from an air tank and directing the stream of air from a nozzle, disposed at an end of the tube, to the outer surface of the mask pod. In an embodiment, the method further includes adjusting a distance between the nozzle and the outer surface of the mask pod and keeping a same distance between the nozzle and the outer surface of the mask pod for each one of the plurality of locations. In an embodiment, for each one of the plurality of locations, the stream of air is directed at a first angle of incidence to the outer surface of the mask pod. In an embodiment, the method further includes adjusting a flow rate of the stream of air from the nozzle and adjusting the first angle of incidence, and the first angle of incidence is adjusted between 65 degrees to 25 degrees with respect to perpendicular plane to the surface of the mask pod. In an embodiment, either the outer surface of the mask pod is above the nozzle, the stream of air is directed upward, and the scattered air from the outer surface of the mask pod flows downward, or the outer surface of the mask pod is below the nozzle, the stream of air is directed downward, and the scattered air from the outer surface of the mask pod flows upward.

According to some embodiments of the present disclosure, a method for inspecting the particles on a mask pod includes directing a stream of gas at a plurality of locations on an outer surface of a mask pod and removing one or more particles by the directed stream of gas from each one of the plurality of locations on the outer surface of the mask pod. The method also includes sampling scattered gas from the outer surface of the mask pod at the plurality of locations to determine a first number of particles in the scattered gas from the plurality of locations. For each location of the plurality of locations, the first number of particles in the scattered gas is proportional to a number of particles on the outer surface of the mask pod at that location. In an embodiment, the method further includes determining a map of the particles on the mask pod based on the determined first number of particles at the plurality of locations. In an embodiment, the stream of gas is a stream of clean dry air. In an embodiment, prior to directing the stream of gas, the method includes receiving a photomask inside a dual mask pod, opening an outer pod of the dual mask pod, and removing an inner pod of the dual mask pod as the mask pod and the photomask is inside the inner pod. In an embodiment, the method further includes cleaning the mask pod when the number of particles on the outer surface of the mask pod is above a threshold number of particles for one or more locations of the plurality of locations. In an embodiment, the method further includes directing the stream of gas from a nozzle to the outer surface of the mask pod. In an embodiment, the method further includes adjusting a distance between the nozzle and the outer surface of the mask pod and keeping a same distance between the nozzle and the outer surface of the mask pod for each one of the plurality of locations.

According to some embodiments of the present disclosure, a system for inspecting the particles on a mask pod includes a gas source, a mask pod, a circuitry, and a first pipe having a nozzle connected to a first end of the first pipe. The system also includes a gas flow controller connected between to the gas source and a second end of the first pipe and the gas flow controller directs a stream of gas, supplied by the gas source via the first pipe, out of the nozzle. The system further includes a horizontal-stage that holds the mask pod and moves the mask pod in two perpendicular horizontal directions above the nozzle. The gas flow controller directs the stream of gas at a plurality of locations of an outer surface of the mask pod to remove one or more particles, by the directed stream of gas, from the outer surface of the mask pod. The system includes a particle counter coupled to a first end of a second pipe. The particle counter draws scattered gas from the plurality of locations, via a second end of the second pipe, into the particle counter, to determine a sample of a number of the removed particles from the outer surface of the mask pod at the plurality of locations. In an embodiment, the system further includes a vertical-stage such that the first end of the first pipe having the nozzle and the second end of the second pipe are mounted on a top surface of the vertical-stage. The vertical-stage moves up and down to adjust a distance between the top surface of the vertical-stage with the outer surface of the mask pod. In an embodiment, the system further includes a stage controller coupled to the horizontal-stage and the vertical-stage such that the stage controller adjusts the distance between the top surface of the vertical-stage with the outer surface of the mask pod in a Z-direction. The stage controller moves the horizontal-stage in an X-direction and a Y-direction to direct the stream of gas at the plurality of locations in the X-direction and the Y-direction on the outer surface of the mask pod. In an embodiment, a distance between each two neighboring locations of the plurality of locations in the X-direction or in the Y-direction is between about 1 millimeter and about 1 centimeter. In an embodiment, the circuitry receives X-direction and Y-direction data corresponding to the plurality of locations, receives the sampled number of removed particles from the outer surface of the mask pod at the plurality of locations, and generates a map of the sampled number of removed particles from the outer surface of the mask pod, the system further includes a mapping system coupled to the circuitry to receive the map of the sampled number of removed particles from the circuitry and to display the sampled number of removed particles. In an embodiment, the sampled number of removed particles is proportional to a number of particles on the outer surface of the mask pod.

As described in the foregoing embodiments, a map of the particle on an outer surface of a mask pod is generated without rotating the mask pod to take images of the irregular outer surface with image processing techniques.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   moving a stage holding a mask pod such that the stage stops at each location of a plurality of locations under an outer surface of the mask pod for a predefined amount of time;
   at each location of the plurality of locations,
     directing a stream of air to the outer surface of the mask pod;
     capturing an image of scattered air from each location of the plurality of locations of the outer surface of the mask pod; and
     determining a number of particles in the scattered air as a sampled number of particles based on the captured image; and
   generating a map of particles on the outer surface of the mask pod based on the sampled number of particles at each of the plurality of locations.

2. The method of claim 1, wherein:
   the stage is moved in an X-direction and a Y-direction, and
   the plurality of locations are distributed in the X-direction and the Y-direction on the outer surface of the mask pod.

3. The method of claim 1, further comprising:
   delivering the stream of air by a tube from an air tank; and
   directing the stream of air from a nozzle, disposed at an end of the tube, to the outer surface of the mask pod.

4. The method of claim 3, further comprising:
   adjusting a distance between the nozzle and the outer surface of the mask pod such that a same distance between the nozzle and the outer surface of the mask pod is maintained at each location of the plurality of locations.

5. The method of claim 3, wherein, at each location of the plurality of locations, the stream of air is directed at a first angle of incidence to the outer surface of the mask pod.

6. The method of claim 5, further comprising:
   adjusting a flow rate of the stream of air from the nozzle; and
   adjusting the first angle of incidence, wherein the first angle of incidence is adjusted between 65 degrees to 25 degrees with respect to a perpendicular plane to the outer surface of the mask pod.

7. The method of claim 3, wherein either:
   the outer surface of the mask pod is located above the nozzle and the stream of air is directed upward, or
   the outer surface of the mask pod is located below the nozzle and the stream of air is directed downward.

8. The method of claim 1, wherein the mask pod is an inner pod of a dual mask pod, and the method further comprises:
   receiving the dual mask pod holding a photomask therein;
   opening an outer pod of the dual mask pod; and
   removing the inner pod of the dual mask pod.

9. The method of claim 1, further comprising:
   cleaning the mask pod when the number of particles on the outer surface of the mask pod is above a threshold number of particles for one or more locations of the plurality of locations.

10. A system, comprising:
    a gas source;
    a moving stage configured to hold a mask pod;
    a stage controller configured to control movement of the moving stage;
    a gas nozzle coupled to the gas source;
    an imager; and
    a processor, wherein:
      the gas source and the gas nozzle are configured to eject a stream of gas to the mask pod when the mask pod is held by the moving stage,
      the moving stage is controlled such that the mask pod is moved in two perpendicular horizontal directions such that the stream of gas is applied to a plurality of locations of an outer surface of the mask pod, and the moving stage stops at each location of the plurality of locations for a predefined amount of time, and
      the processor is configured to capture an image by the imager of scattered air from each location of the plurality of locations and generate a particle map of the outer surface of the mask pod based on the captured images.

11. The system of claim 10, further comprising a vertical-stage configured to vertically move the gas nozzle and the gas nozzle to adjust a distance between the gas nozzle and the outer surface of the mask pod.

12. The system of claim 11, wherein the stage controller is configured to adjust a location of the mask pod in an X-direction and a Y-direction.

13. The system of claim 12, wherein a distance between each two neighboring locations of the plurality of locations in the X-direction or in the Y-direction is between about 1 millimeter and about 1 centimeter.

14. The system of claim 12, wherein the gas nozzle is inclined by a first angle with respect to a perpendicular plane to the outer surface of the mask pod.

15. The system of claim 14, wherein the first angle is between 65 degrees to 25 degrees with respect to the perpendicular plane to the outer surface of the mask pod.

16. A system, comprising:
    a gas source;
    a moving stage configured to hold a mask pod;
    a gas nozzle coupled to the gas source;
    an imager; and
    one or more controllers, wherein:
      the one or more controllers are configured to perform:
      moving the moving stage holding the mask pod such that the moving stage stops at each location of a plurality of locations under an outer surface of the mask pod for a predefined amount of time;
      at each location of the plurality of locations,
        directing a stream of gas from the gas nozzle to the outer surface of a mask pod;
        capturing an image of scattered air from each location of the plurality of locations of the outer surface of the mask pod using the imager; and
        determining a number of particles in the scattered air as a sampled number of particles based on the captured image; and
      generating a map of particles on the outer surface of the mask pod based on the sampled number of particles at each of the plurality of locations.

17. The system of claim 16, wherein the moving stage is configured to vertically change a distance between the gas nozzle and the outer surface of the mask pod.

18. The system of claim 16, wherein:
    the moving stage is configured to move in an X-direction and a Y-direction, and the plurality of locations are distributed in the X-direction and the Y-direction on the outer surface of the mask pod.

19. The system of claim 16, further comprising a vertical-stage configured to vertically move the gas nozzle to adjust a distance between the gas nozzle and the outer surface of the mask pod.

20. The system of claim 19, wherein a distance between each two neighboring locations of the plurality of locations in an X-direction or in a Y-direction is between about 1 millimeter and about 1 centimeter.

* * * * *